US012796331B2

(12) United States Patent
Wang et al.

(10) Patent No.: US 12,796,331 B2
(45) Date of Patent: Nov. 10, 2026

(54) STRETCHABLE PIEZOELECTRIC BIOCRYSTAL THIN FILMS

(71) Applicant: Wisconsin Alumni Research Foundation, Madison, WI (US)

(72) Inventors: Xudong Wang, Middleton, WI (US); Jun Li, Evanston, IL (US)

(73) Assignee: Wisconsin Alumni Research Foundation, Madison, WI (US)

( * ) Notice: Subject to any disclaimer, the term of this patent is extended or adjusted under 35 U.S.C. 154(b) by 890 days.

(21) Appl. No.: 18/130,521

(22) Filed: Apr. 4, 2023

(65) Prior Publication Data

US 2024/0341196 A1 Oct. 10, 2024

(51) Int. Cl.

| | |
|---|---|
| ***H10N 30/85*** | (2023.01) |
| ***C08J 7/04*** | (2020.01) |
| ***D01F 4/00*** | (2006.01) |
| ***H02N 2/18*** | (2006.01) |
| ***H10N 30/092*** | (2023.01) |

(52) U.S. Cl.

CPC .......... *H10N 30/852* (2023.02); *C08J 7/0427* (2020.01); *D01F 4/00* (2013.01); *H02N 2/186* (2013.01); *H10N 30/092* (2023.02); *C08J 2383/04* (2013.01); *C08J 2477/04* (2013.01); *D10B 2401/16* (2013.01)

(58) Field of Classification Search

CPC .. C08J 7/0427; C08J 2383/04; C08J 2477/04; H10N 30/098; H10N 30/852; H10N 30/092; H10N 30/857; H02N 2/186; D01F 4/00; D10B 2401/16

See application file for complete search history.

(56) References Cited

U.S. PATENT DOCUMENTS

| | | | | |
|---|---|---|---|---|
| 12,144,260 B2 * | 11/2024 | Wang | .................. | H10N 30/872 |
| 12,185,635 B2 * | 12/2024 | Gazit | .................. | C07K 5/0806 |
| 2017/0044690 A1 * | 2/2017 | Haynie | .................. | D04H 1/728 |
| 2022/0176171 A1 * | 6/2022 | Nguyen | ............... | A62B 23/025 |

* cited by examiner

*Primary Examiner* — J. San Martin
(74) *Attorney, Agent, or Firm* — Boyle Fredrickson, S.C.

(57) ABSTRACT

A stretchable piezoelectric thin film, and method of manufacture, an open mesh structure formed by a repeating branching and joining pattern. The thin film is manufactured by slowly lifting amino acid nanofibrils from a water-alcohol biphasic solvent. The film automatically assembles into a truss-like mesh network of amino acid nanofibrils that allows the open meshes to close with narrowed intersection angles between the amino acid nanofibrils. The alcohol molecules of the water-alcohol biphasic solvent preferably bind to the carboxyl groups on the amino acid surfaces thus limiting the growth along the side facets of the amino acid surfaces and promoting growth along the growth front producing a bifurcation in the amino acid biocrystal network.

20 Claims, 3 Drawing Sheets

Fig. 1
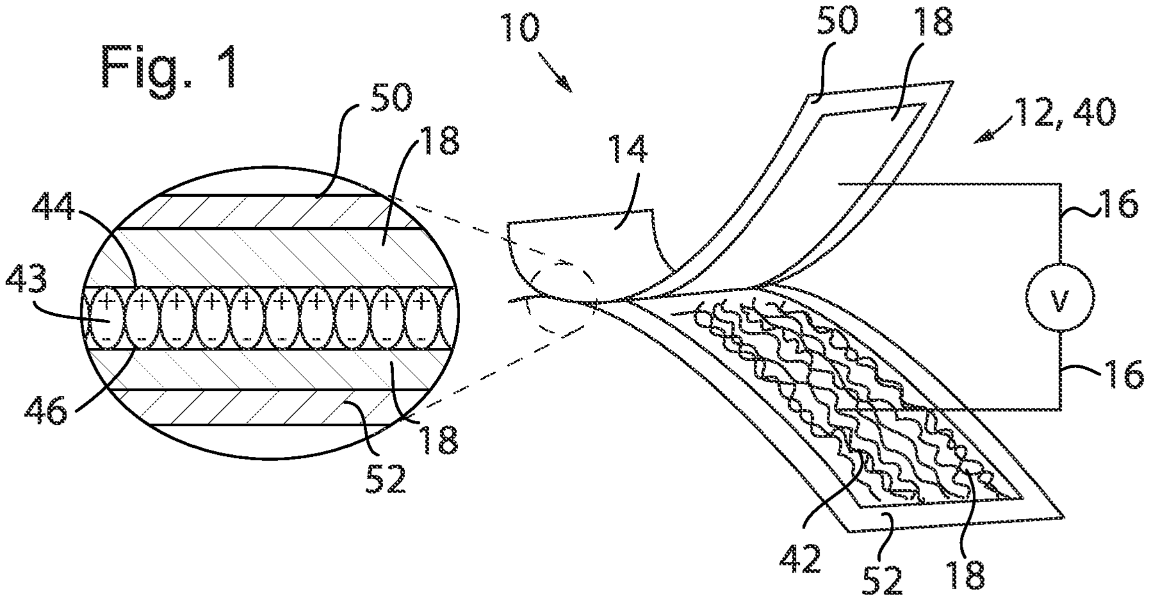
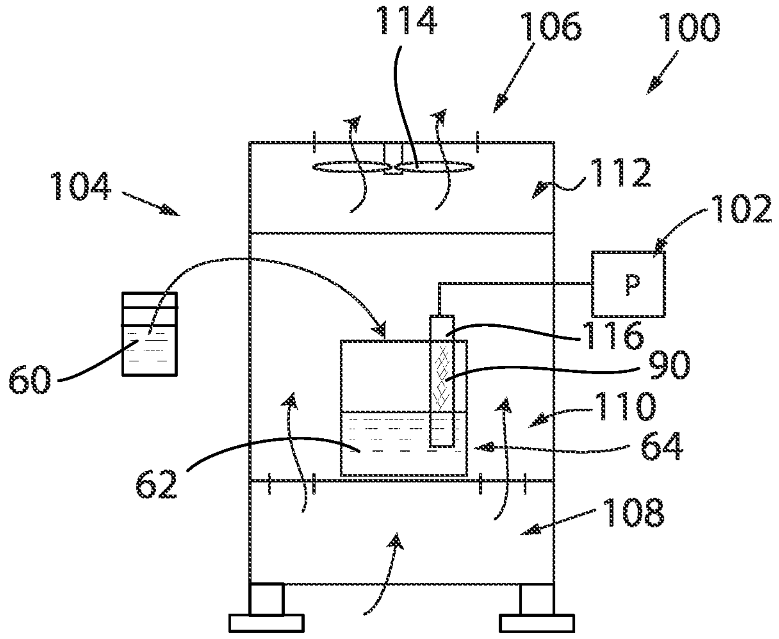
Fig. 2

STRETCHABLE PIEZOELECTRIC BIOCRYSTAL THIN FILMS

STATEMENT REGARDING FEDERALLY SPONSORED RESEARCH OR DEVELOPMENT

This invention was made with government support under HL 157077 awarded by the National Institutes of Health. The government has certain rights in the invention.

BACKGROUND OF THE INVENTION

The present invention relates to biomaterials exhibiting piezoelectric properties, and more particularly, to a piezoelectric film with piezoelectricity that can be used to power implantable medical devices.

Nanogenerators (NGs) are devices that convert mechanical or thermal energy produced from small scale physical changes into electricity. Piezoelectric generators (PGs) and triboelectric generators (TENGs) are particular nanogenerators that can convert mechanical energy into electricity.

Specifically, piezoelectric generators are devices that use the piezoelectric effect of materials to harvest mechanical energy for the creation of self-powered systems. The piezoelectric effect is an electric charge that accumulates in certain solid materials in response to an applied mechanical stress, facilitating the conversion of mechanical energy to electrical energy and vice vera. This material property is a relatively common phenomenon that can be found in many organic and inorganic materials.

Medically implantable and mountable devices have become an emerging application for nanogenerators such as piezoelectric generators that can harvest ambient mechanical energy. The piezoelectric materials of these nanogenerators can harvest the small mechanical energy of the body, i.e., small body motions or movement of the human body, to provide self-powered energy generation to the implantable and mountable medical devices for continuous and in vivo monitoring, diagnosis, drug delivery, and therapeutic functions. Implantable and mountable medical devices can be affixed to tissue or organ surfaces inside or outside the body.

Clinically available implantable and mountable medical devices include tactile sensors, artificial skins, cardiac pacemakers, defibrillators, cochlear implants, infusion pumps, and neurostimulators. However, these implantable and mountable medical devices, especially devices using piezoelectric materials, are typically rigid and hard and do not allow for stretchability when interfacing with soft tissues or organs. The intrinsic rigidity and hardness of the crystalline phase of piezoelectric materials is a major roadblock to stretchability. Therefore, current implantable and mountable piezoelectric medical devices do not provide mechanical properties which allow for stretchability of the electronic materials or contents therein.

SUMMARY OF THE INVENTION

Human tissues and organs are soft and constantly moving or deforming, for example, about 20-30% tensile strain for skin. Multidirectional stretchability is desired for implantable medical devices interfacing with these internal tissues and organs. Stretchability is a measure of deformability or the ability of the material to remain stable under applied deformation. Deformation is a measure of how much the material is stretched and strain is the ratio between deformation and the original length.

Stretchable piezoelectric nanogenerators allow for a certain amount of deformation and strain, and therefore, permit biomechanical stretching of the tissue and organs to be converted into electrical energy in vivo. Stretchable piezoelectric films can be an effective way to build a tissue-compatible stretchable piezoelectric nanogenerator which can form to and stretch with various tissue and organ structures. Thus, a tissue-compatible stretchable piezoelectric nanogenerator can operate under multi-dimensional strains of human tissue and organs to provide improved self-powered energy generation in vivo.

Tissue-like stretchability is particularly challenging for piezoelectric materials and piezoelectric films. Generally, piezoelectricity is a result of long-range ordering of internal molecular or ionic dipoles. Thus, a complete crystalline phase with aligned polarization is necessary to achieve piezoelectric performance but results in a material that is rigid, fragile, and has weak strain tolerance.

Organic piezoelectric biocrystals such as amino acids, peptides, and cellulose have excellent biocompatibility and biodegradability (compared to inorganic piezoelectric materials), making them good candidates for implantable medical devices. However, they exhibit weak strain tolerance because of weak intermolecular bonding and temperature-sensitive chemistry making it difficult to keep their crystalline structure and piezoelectric properties intact while enabling stretchability.

The present invention provides a stretchable piezoelectric film, and method of manufacture, formed of a large-scale, multi-directionally stretchable, piezoelectric biocrystal network. The tissue-like stretchability of the film is enabled by a continuous truss-like pattern formed by self-assembled supramolecular packing of interconnected DL-alanine microfibers (MFs) along certain crystallographic directions when DL-alanine nanofibrils are pulled from a water-ethanol solution on a hydrophilic substrate. The continuous truss-like pattern of the present invention provides an open mesh structure formed by a repeating branching and joining pattern of DL-alanine MFs. The open mesh structure of the continuous and ordered crystalline network provides multi-directional stretchability that is orders of magnitude higher than the fracture limit of bulk crystals. The stretchable, biocompatible, and biodegradable piezoelectric film enables stretchable, implantable, and degradable electromechanical devices that can conform to deformable tissues and large tissue strains. A spontaneous and uniform piezoelectric polarization is retained over the entire piezoelectric film.

The thin piezoelectric film is manufactured by slowly lifting DL-alanine nanofibrils from a DL-alanine water-ethanol biphasic solvent on a hydrophilic substrate. The ethanol molecules of the DL-alanine water-ethanol biphasic solvent preferably bind to the carboxyl groups on the DL-alanine nanofibril surfaces thus reducing the interaction with additional DL-alanine nanofibrils along the side facets of the DL-alanine microfibers and promoting the addition of DL-alanine nanofibrils along a growth front terminated with amine groups producing bifurcations in the DL-alanine biocrystal network.

One embodiment of the present invention is a thin film of piezoelectric material comprising a network of amino acid microfibers composed of nanofibrils with aligned polarization along a pulling axis and comprising a first branch of microfibers; and a second branch of microfibers; wherein the first and second branches of microfibers are joined and separated repeatedly along the pulling axis to form mesh openings to permit an increase in width and length when stretched.

It is thus a feature of at least one embodiment of the present invention to manufacture a truss-like network of microfibers that resemble foam net sleeves or foam mesh packaging used to protect individual fruit, which can expand and retract to provide structure-enabled stretchability rather than relying on a stretchable quality of the crystalline amino acid network itself.

The microfibers may be composed of DL-alanine nanofibrils.

It is thus a feature of at least one embodiment of the present invention to utilize the properties of DL-alanine molecules which permit binding with ethanol molecules along their side facets to promote bifurcations along the side facets to create a truss-like network structure.

The mesh openings may be triangular or quadrilateral in shape.

It is thus a feature of at least one embodiment of the present invention to allow the truss-like network to mostly keep straight alignment of microfibers while also forming triangular or quadrilateral open mesh units.

The width of the mesh openings may be increased and the length of the mesh openings may be decreased when stretched perpendicular to the pulling axis. The length of the mesh openings may be increased and the width of the mesh openings may be decreased when stretched along the pulling axis.

It is thus a feature of at least one embodiment of the present invention to allow the open mesh units to expand by manipulating the geometry of the open mesh units similar to that of accordion style gates.

The first branch of microfibers and second branch of microfibers may be joined at an angle in the range of about 15 to 30 degrees when stretched perpendicular to the pulling axis.

It is thus a feature of at least one embodiment of the present invention to create small contact angles that present large interfacial areas at the nanofibril junctions permitting more interfacial hydrogen bonds and thus creating increased structural stability.

The first branch of microfibers and second branch of microfibers may be joined at an angle in the range of about 10 to 25 degrees when stretched along the pulling axis.

It is thus a feature of at least one embodiment of the present invention to allow for the release of built up strain energy by breaking interfacial hydrogen bonds between joining microfiber branches allowing for additional stretch.

The microfibers may have a growth front extending perpendicular to side facets extending along the pulling axis wherein the first and second branch of microfibers are joined and separated along the side facets of the microfibers.

It is thus a feature of at least one embodiment of the present invention to assemble nanofibril growth at the growth face but the formation of the truss-like structure along the side facets to maintain the repeating joining and bifurcating pattern along the growth axis only.

The thin film of piezoelectric material may further comprise alcohol molecules wherein the alcohol molecules are bonded to carboxyl groups of the microfibers.

It is thus a feature of at least one embodiment of the present invention to produce the truss-like network through the interaction of alcohol molecules with the amino acid molecules where the bonding of carboxyl groups limits growth of nanofibrils along the side facets and instead favors growth along the growth face through bonding to amine groups to promote the creation of bifurcating features along the side facets.

The first and second branches of microfibers may be joined by interfacial hydrogen bonds.

It is thus a feature of at least one embodiment of the present invention to promote interfacial hydrogen bonding which leads to generally straight DL-alanine nanofibril formation (i.e., DL-alanine crystalline structure) to maintain high piezoelectricity within the structure.

The network of amino acid microfibers may withstand up to 40% tensile strain along multiple directions without breaking.

It is thus a feature of at least one embodiment of the present invention to produce high stretchability which is consistent with the stretchability levels of human tissue to capture the small movement of human tissue.

The network of amino acid microfibers may be less than 50 micrometers thick.

It is thus a feature of at least one embodiment of the present invention to permit the piezoelectric material to be used within a piezoelectric generator attached to the human tissue.

The thin film of piezoelectric material may further comprise at least one electrode having a lower resistance than a surface of the network of amino acid microfibers. The thin film of piezoelectric material may further comprise a first wire connected to the at least one electrode and a second wire connected to a second electrode or ground, wherein the first wire and second wire deliver an electric charge from the thin film of piezoelectric material. The thin film of piezoelectric material may further comprise an electronic circuit configured to consume electrical power provided by the at least one electrode.

It is thus a feature of at least one embodiment of the present invention to permit use of the piezoelectric generator to power the medical device without an external power source.

The network of amino acid microfibers may further comprise a plurality of first branches of microfibers; and a plurality of second branches of microfibers; wherein the pluralities of first and second branches of microfibers are joined and separated repeatedly along the axis to form mesh openings therebetween to permit an increase in width and length of the mesh openings when stretched.

It is thus a feature of at least one embodiment of the present invention to form a mesh structure that spans the entire footprint of the thin film.

One embodiment of the present invention is a method of manufacturing a thin film of piezoelectric material comprising: mixing a solute of amino acid molecules with a solution of water-alcohol to form a biphasic solution; slowly pulling a plurality of amino acid nanofibrils from the biphasic solution at a predetermined rate; and forming a network of amino acid microfibers composed of microfibers with aligned polarization along an axis and comprising a first branch of microfibers and a second branch of microfibers wherein the first and second branches of microfibers are joined and separated repeatedly along the axis to form mesh openings therebetween that are in an open state when unstretched and a closed state when stretched.

It is thus a feature of at least one embodiment of the present invention to manufacture a piezoelectric thin film with the assistance of a water-alcohol solution of a desired mixing ratio which promotes bifurcating features through the bonding of alcohol molecules with the microfibers.

The solute of amino acid may be DL-alanine molecules. The solvent of water-alcohol may be water-ethanol. A ratio of ethanol-to-water may be about 3:1 to 4:1.

It is thus a feature of at least one embodiment of the present invention to promote branching of the nanofibrils but not causing deflection of the branches causing unwanted curving of the branches.

Alcohol molecules of the solution of water-alcohol may bond to carboxyl groups of the microfibers and amino and carboxyl groups of the microfibers may form hydrogen bonds to define a bifurcating feature and a joining feature between the first and second branches of microfibers.

It is thus a feature of at least one embodiment of the present invention to favor bifurcation through the bonding of carboxyl groups and surface tension interruption, and joining of nanofibrils via interfacial hydrogen bonds.

The method may further comprise stretching the thin film of piezoelectric material along multiple directions to 40% tensile strain without breaking the thin film of piezoelectric material.

It is thus a feature of at least one embodiment of the present invention to permit multi-directional stretching of the thin film without adversely affecting the piezoelectric effect.

These particular objects and advantages may apply to only some embodiments falling within the claims and thus do not define the scope of the invention.

BRIEF DESCRIPTION OF THE DRAWINGS

FIG. 1 is a perspective view of an implantable medical device of one embodiment of the present invention providing an encapsulation housing attachable to the body of a human patient and supporting a piezoelectric power generator that relies upon biomechanical motions of the body to be harvested by the piezoelectric power generator;

FIG. 2 is a schematic representation of an assembly method of FIG. 1 showing a piezoelectric thin film of the piezoelectric power generator being formed by mixing (a) a plurality of amino acid molecules with (b) a water-alcohol solvent to create an amino acid water-alcohol biphasic solution with a preferred mixing ratio;

DETAILED DESCRIPTION OF THE PREFERRED EMBODIMENT

Figure 3:
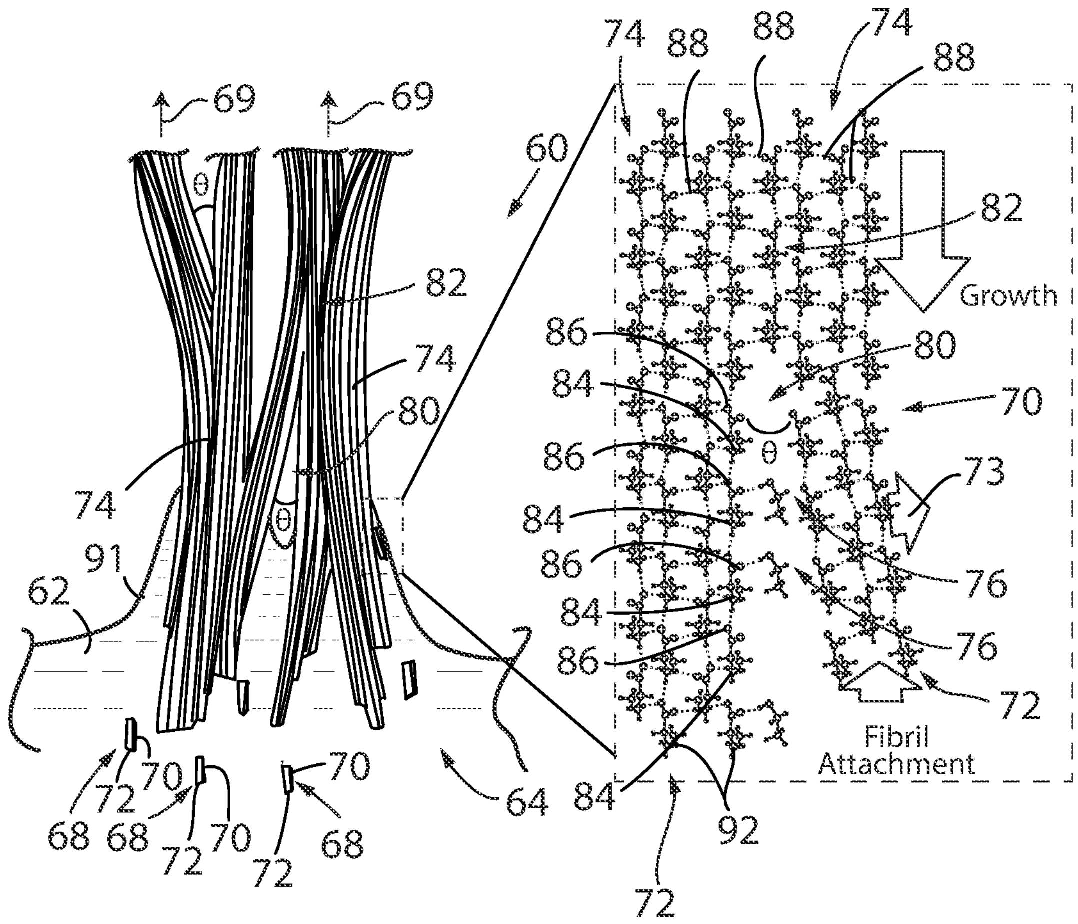
FIG. 3 is a partial schematic representation of the piezoelectric thin film of FIGS. 1 and 2 showing the piezoelectric thin film being formed by slowly lifting the hydrophilic substrate from the biphasic solution and the amino acid network exhibiting branching and joining of the formed amino acid microfibers driven by solvent-molecular interaction and surface tension.

Referring to FIG. 1, an implantable medical device 10 of the present invention may be a stretchable medical electronic device including an energy generator 12 supported within an outer encapsulation 14 that may be implanted inside or fixed to a human patient's body. The electric energy generator 12 supported by the encapsulation 14 can convert the biomechanical energy of the human patient's body into electrical energy that is then used by, for example, electrical conductors 16 and an electrode pair 18 to power the implantable medical device 10. An electric potential or voltage is applied between the electrode pair 18 to power the implantable medical device 10.

The energy generator 12 held within the encapsulation package 14 may be a nanogenerator (NG) converting mechanical energy produced by microscale mechanical changes into an electrical charge inducing an electric potential. The energy generator 12 may be "self-generating" in that it produces energy without the need for an external power source such as an alternating current (AC) or direct current (DC) power generator or a pre-charged battery as known in the art.

In one embodiment of the present invention, the energy generator 12 is specifically a piezoelectric nanogenerator 40 used to harvest mechanical energy from the patient's body movements into electricity to induce an electric potential. The piezoelectric nanogenerator 40 may harvest the movement of the patient's body or muscle motions to produce electrical energy. The movement of the body tissue and muscles may be produced by muscle stretching, breathing, blood pulsing and other voluntary and involuntary body movements of the patient. For example, slight movements of the body tissue or muscles may be captured when the patient inhales and exhales or with blood pulsing.

It is understood that the piezoelectric nanogenerator 40 is desirably lightweight with a minimized size and thickness to be easily implanted. An area of the piezoelectric nanogenerator 40 may have a length that is less than 2 cm and less than 1 cm and a width that is less than 2 cm and less than 1 cm. The piezoelectric nanogenerator 40 may be both flexible and stretchable with a thin profile commonly using soft electronic materials so that it may comply with the body's bending and stretching movements. The energy generator 12 may be less than 2 cm and less than 1 cm in thickness. The piezoelectric nanogenerator 40 may be manufactured of biocompatible material to be non-toxic to the patient when worn.

Generally, the piezoelectric nanogenerator 40 is able to apply an electric potential or voltage between the electrode pair 18 to power the implantable medical device 10 by utilizing a nano-structured piezoelectric material or a piezoelectric thin film 42 such that when an external force is applied, an electric field is created across the piezoelectric material which can apply an electric potential across electrical conductors 16 to the external load as known in the art. The piezoelectric thin film 42 is defined by an alignment of poles of amino acid biocrystals 43 with a truss-like mesh network across the entire piezoelectric thin film 42 with the assistance of an interacting water-glycol solution 62. The self-alignment of the amino acid biocrystals 43 in a truss-like mesh network results in a layer of polarization aligned amino acid biocrystals 43 that provides a substantially uniform piezoelectric property but also stretchability properties.

In one embodiment, piezoelectricity of the piezoelectric thin film 42 may be harvested by attaching the piezoelectric thin film 42 to a pair of electrodes 18 with a lower resistance than the outer surfaces 44, 46 of the piezoelectric thin film 42 that can apply a voltage difference between the outer surfaces 44, 46 of the piezoelectric thin film 42. The outer surfaces 44, 46 of the piezoelectric thin film 42 may be sandwiched between the pair of electrodes 18. In one embodiment, the pair of electrodes 18 may be percolated silver nanowires attached to the outer surfaces 44, 46 of the piezoelectric thin film 42. The thickness of the electrodes 18 may be approximately 100 nm. It is understood that other conductive, biocompatible materials may be used as the pair of electrodes 18 such as molybdenum, magnesium, iron, zinc and tungsten.

The pair of electrodes 18 may be further attached to electrical conductors 16, respectively, that can communicate the electrical charge through the electrical conductors 16. The electrical conductors 16 may be insulated conducting wires, for example, copper wires insulated with polydimethylsiloxane (PDMS) to prevent charge from flowing to the surrounding tissue being dissipated in surrounding tissue or exposing the tissue to chemical reactions. The electrical conductors 16 may be further connected to an electronic circuit communicating with the wire conductors 16 to consume electrical power provided by the pair of electrodes 18 and measure a voltage between the outer surfaces 44, 46 of the piezoelectric thin film 42.

It is understood that other configurations of the electrodes or a single electrode may be used with the piezoelectric thin film 42 to apply a voltage difference between one or both of the outer surfaces 44, 46 of the piezoelectric thin film 42, and to convert electric signals by generating periodically distributed mechanical forces via the piezoelectric thin film 42.

For example, in an alternative embodiment, a pair of interdigitated electrodes may be attached to one of the outer surfaces 44, 46 of the piezoelectric thin film 42 in an interlocking finger-like periodic pattern of parallel in-plane electrodes and a voltage difference applied between the two parallel in plane electrodes with an electronic circuit connected between the electrodes, as understood in the art. In another alternative embodiment, a single electrode may be attached to one of the outer surfaces 44, 46 of the piezoelectric thin film 42 and a voltage difference applied between the single electrode and a ground wire with an electronic circuit connected between the electrode and ground, as understood in the art.

The encapsulation 14 may include a pair of rectangular encapsulation films 50, 52 cast over and under the piezoelectric thin film of the piezoelectric nanogenerator 40 to create at least one tissue contacting surface. The encapsulation films 50, 52 may be a similar size and joined to form a rectangular pouch or pocket enclosing the piezoelectric nanogenerator 40 therein so that the piezoelectric nanogenerator 40 is completely sealed and at most, only the electrical conductors 16, for example, biocompatible leads or part of the biocompatible leads, remain exposed and extend out from the encapsulation 14. The encapsulation films 50, 52 are flexible and stretchable permitting the piezoelectric nanogenerator 40 to flex and stretch with the tissue movement. The encapsulation films 50, 52 may be PDMS films.

The encapsulation 14 may be as described in U.S. application Ser. No. 17/580,890, titled "A Stretchable Encapsulation Material with High Dynamic Water Resistivity and Tissue-Matching Elasticity," assigned to the present applicant, and hereby incorporated by reference.

Different modes, models, and configurations of the piezoelectric nanogenerator 40 may be used in connection with the present invention to produce the electric potential at the external load to power the external load with certain embodiments described below. The piezoelectric nanogenerator 40 is generally able to reach area power densities up to 500 $W/m^2$, volume density up to 490 $kW/m^3$, and a corresponding conversion total energy conversion efficiency of 49% to 85%.

Referring also to FIG. 2, the desired piezoelectric thin film 42 for use with the present invention is both flexible (i.e., can be bent and twisted without breaking) and stretchable (i.e., can be lengthened or widened a length while resuming its former shape without breaking) so that it may be used with moving body tissues and organs and capture its movements. The piezoelectric thin film 42 is generally formed by mixing (a) an amino acid solute 60, for example, preferably DL-alanine ($C_3H_7NO_2$) molecules, with (b) a water-alcohol solvent 62, for example, preferably water-ethanol solvent, to dissolve the amino acid solute 60 in the water-alcohol solvent 62 to produce an amino acid water-alcohol biphasic solution 64 of self-assembled rod-like nanofibrils 68, for example, preferably DL-alanine nanofibrils 68.

As will be described in further detail below, the rod-like nanofibrils 68 are slowly pulled from the biphasic solution 64 on a hydrophilic substrate 116 to form a truss-like mesh network 78 of amino acid microfiber precipitate 90 across the entire piezoelectric thin film 42.

In one embodiment, as seen in FIG. 2 and described generally, the manufacturing system 100 for forming the piezoelectric thin film 42 consists of a syringe pump 102, a three-layer growth chamber 104 (i.e., bottom layer 108, middle layer 110, and top layer 112), and an air flow system 106.

The bottom layer 108 and top layer 112 of the three-layer growth chamber 104 may be filled with desiccants to adjust and stabilize the humidity in middle layer two 110. Middle layer 110 is a volume with constant temperature (about 23° C.) and humidity (about 15%) where truss-like mesh network growth may occur.

Air flow may be regulated by the air flow system 106 and by tuning the power of fans 114 of the top layer 112 so that the convention flow and evaporation speed are set to a predetermined rate.

The syringe pump 102 may be used to control the pulling out speed of a wafer surface of a hydrophilic substrate 116 supporting the rod-like nanofibrils 68 from the biphasic solution 64.

Referring now to FIGS. 2 and 3, the amino acid solute 60 is comprised of a plurality of molecules that form self-aligned nanofibrils 68 at the meniscus 91 of the biphasic solution 64. The nanofibrils 68 have multiple side facets 70, which are rich in hydrogen bonds 88, and a growth front 72 terminating at amine groups 92 where additional nanofibrils 68 may join and build to form a plurality of microfiber branches 74 with corresponding large scale side facets 70 and growth fronts 72. The microfiber branches 74 build and intersect to produce precipitated microfibers 90 which continue to build on the hydrophilic substrate 116 to form an amino acid biocrystal network 78 in a preferred configuration described below.

In one embodiment, the amino acid solute 60 is a DL-alanine solute. Specifically, alanine is one of the twenty amino acids existing naturally in nature. Alanine exists in two isomeric forms, D-alanine and L-alanine, and a racemic mixture of the two forms results in DL-alanine. D-alanine and L-alanine molecules are packed into the DL-alanine nanofibrils 68 when mixed with the water-alcohol solvent 62. The top and bottom surfaces of the self-aligned DL-alanine nanofibrils 68 contain fibrous fine features indicating that the DL-alanine nanofibrils 68 are assembled by adding nanofibril building blocks along the top and/or bottom growth fronts 72.

DL-alanine powders may be commercially available from, for example, Santa Cruz Biotechnology, Inc. of Dallas, Texas. DL-alanine powders have a homogenous diffraction ring pattern corresponding to random orientation which become aligned in the self-assembly growth process. DL-alanine nanofibril networks resemble the extracellular matrix of tissue, thus, are desirable amino acids for medical applications.

The use of a water-alcohol solvent 62 assists with building the nanofibrils 68 into a preferred crystalline amino acid network 78. The amino acid solute 60 is soluble in a mixed solvent 62 of water and alcohol to form the biphasic solution 64 where the DL-alanine nanofibrils 68 forms near the meniscus 91. In one embodiment, the water-alcohol solvent 62 is a water-ethanol solvent. The ratio of ethanol-to-water affects the crystal morphology of the resulting amino acid biocrystal network 78 as further described below.

Once the amino acid water-alcohol biphasic solution 64 is formed by dissolving the amino acid solute 60, e.g., DL-alanine powder (or raw material), into the water-alcohol solvent 62 where the DL-alanine molecules self-assemble into nanofibrils 68 near the meniscus of the biphasic solution 64, the hydrophilic substrate 116 which is submerged in the biphasic solution 64 is slowly lifted at a predetermined speed along a pulling direction 69 (for example, vertically upward) from the biphasic solution 64. As the hydrophilic substrate 116 is pulled in the pulling direction 69 from the biphasic solution 64, the capillary forces and Marangoni flow drive the nanofibrils 68 to the meniscus 91 where electrostatic interaction and hydrogen bonding 88 between the amino groups 84 and carboxyl groups 86 direct the oriented attachment of additional nanofibrils 68 to the growth front 72 of nanofibrils 68 of the precipitated microfibers 90 to form the microfiber branches 74 as seen in FIG. 3.

The microfiber branches 74 of nanofibrils 68 are self-assembled through a supramolecular packing process that is governed by electrostatic interaction and interfacial hydrogen bonding 88 of amino groups 84 and carboxyl groups 86 which leads to a straight fibrous morphology. The addition of alcohol molecules 76 from the biphasic solution 64 diverts nanofibril 68 self-assembly away from the side facets 70 of nanofibrils 68 of the precipitated microfibers 90 and promotes nanofibril 68 self-assembly at the growth front 72 of nanofibrils 68 of the precipitated microfibers 70, as the hydrophilic substrate 116 is lifted. The alcohol molecules 76 will preferably bond to the carboxyl groups 86 on side facets 70 of the nanofibrils 68 of the precipitated microfibers 90, thus limiting the interaction of the side facets 70 with the attachment of additional nanofibrils 68. This selective molecular growth induces a preferred growth of nanofibrils 68 at the growth front 72 of the nanofibrils 68 of the precipitated microfibers 90 and along the pulling direction 69 and a weakened interaction on the side facets 70 leading to less stable attachment of the nanofibrils 68 to and along the side facets 70 compared to the growth front 72.

When the growth front 72 is disturbed by external factors such as surface tension or interfacial roughness that introduces a lateral force 73 on the microfiber branches 74, a bifurcation or "branching" is introduced to the side facets 70 thus producing a bifurcating feature 80 (and then subsequent joining feature 82) in a repeating fashion as the nanofibrils 68 are lifted from the biphasic solution 64 to form bifurcating microfiber branches 74. The joining feature 82 resumes the preferred growth of nanofibrils 68 at the growth front 72 and weakened interaction on the side facets 70 until the next lateral force 73 creates another bifurcating feature 80, and so forth. The bifurcating feature 80 and joining feature 82 occur on the side facets 70 of the nanofibrils 68 where there is a large amount of hydrogen bonding 88 locations that favor the repeating splitting and joining interactions.

By mixing the amino acid solute 60 with the water-alcohol solvent 62 in a desired mixing ratio, the surface tension is adjusted as the hydrophilic substrate 116 is lifted, and the creation of the repeating bifurcating feature 80 and joining feature 82 can be controlled to produce the desired truss-like pattern on the hydrophilic substrate 116. The desired mixing ratio of the biphasic solution 64 changes the amount of alcohol molecules 76 in the biphasic solution 64 which are available to bond to the carboxyl groups 86.

Regular bifurcations 80 are obtained when the ratio of alcohol-to-water ratio of the water-alcohol solvent 62 is about 3:1 to 4:1 where a balanced molecular force and surface tension may be reached. Too much water content and too little alcohol content, for example, an alcohol-to-water ratio of about 2:1, results in less bifurcating features 80 or "branching" features, suggesting that the side facet 70 interaction is too strong to be disturbed by the interfacial tension. Too much alcohol content and too little water content, for example, an alcohol-to-water ratio of about 5:1, leads to curved microfiber formation because of low surface tension and small contact angle not providing enough space or pulling force to induce new branch formation. Too much alcohol content deflects the attachment of nanofibrils 68 to the precipitated microfibers 90 and shifts the nanofibrils 68 orientation gradually during precipitation forming a curved geometry macroscopically.

Figure 4:
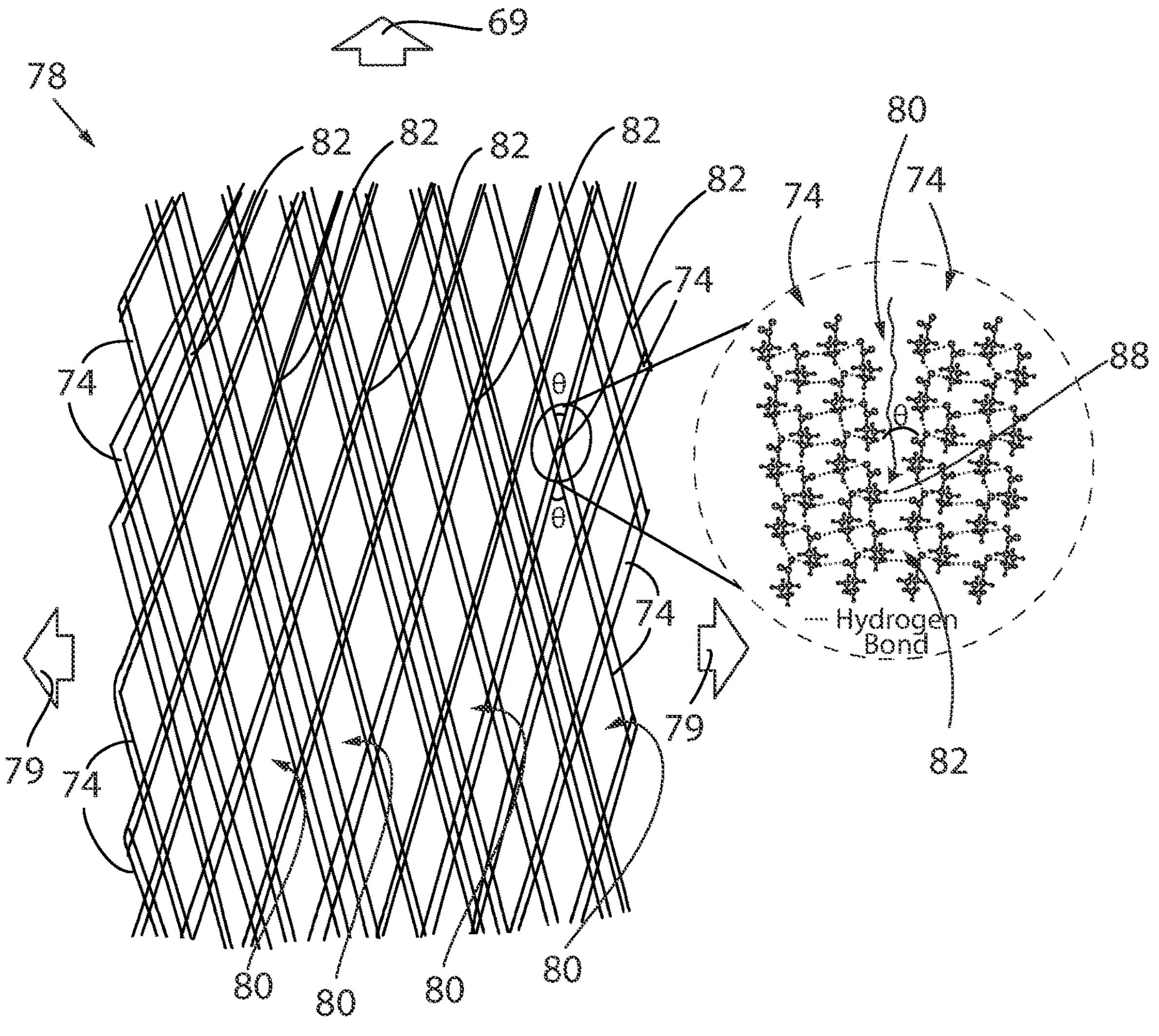
FIG. 4 is a partial schematic representation of the piezoelectric thin film of FIG. 1 having a truss-like mesh network of amino acid microfibers with merging amino acid microfibers releasing built up strain energy by breaking interfacial hydrogen bonds between adjoining amino acid microfibers.

Referring now also to FIG. 4, the repeating pattern of bifurcating features 80 and joining features 82 creates the microfiber branches 74 with a truss-like pattern of interconnected microfiber branches 74 forming an amino acid biocrystal network 78. In particular, the repeating bifurcating feature 80 and joining feature 82 lead to X-shaped junctions at the joining features 82 with angles (θ) between the two joining or dividing microfiber branches 74 measuring in the range of about 10 to 30 degrees and about 15 to 20 degrees when unstretched, which is consistent across the entire amino acid biocrystal network 78. This small contact angle leads to a large interfacial area for interfacial hydrogen bonding 88 at the junctions, which creates high structural stability. When stretched along the pulling direction 69, the angle (θ) between the two joining or dividing microfiber branches 74 may narrow and be about 10 to 25 degrees. When stretched in direction 79 perpendicular to the pulling direction 69, the angle (θ) between the two joining or dividing microfiber branches may widen and be about 15 to 30 degrees.

The nanofibrils 68 are at least partially aligned along the pulling direction 69 with an open mesh structure. The microfiber branches 74 form triangular or quadrilateral units with an average open mesh size in the order of magnitude range of micrometers to millimeters in length and width. The open and "close" or partial narrowing of the truss meshes can endure up to 40% tensile strain along multiple directions including along the pulling direction 69 and in a second direction 79 perpendicular to the puling direction 69.

When stress is applied in the second direction 79, perpendicular to the pulling direction 69, there is a release of built up strain energy by breaking the interfacial hydrogen bonds 88 between joining microfiber branches 74. Since the joining facets are primarily bonded via intermolecular hydrogen bonding 88, the concentrated stress may overcome the hydrogen bonding 88 strength and further pull the two joining microfiber branches 74 apart to release the built-up strain energy. Opening the branch junction by an additional 2-3 μm may lower the local strain by more than 10% relatively (at 20% stretching).

Referring again to FIGS. 1 and 2, the amino acid biocrystal network 78 is preferably grown on a very flat hydrophilic surface substrates 116 with a surface roughness of, for example, about 8 nm, where the bifurcation feature 80 is dominated by the solid-liquid interfacial tension rather than interfacial roughness. Higher surface roughness increases the interface instability and introduces more lateral force 73 leading to much denser and more irregular branches. For example, creating fine trenches on the flat hydrophilic surface substrates 116, which increases the surface roughness, may define the branching distribution and density.

The growth of the amino acid biocrystal network 78 may be achieved on a variety of hydrophilic substrates 116 including ceramics (for example, glass), metals (for example, gold), and polymers (for example, poly(methyl methacrylate)). In one embodiment, the hydrophilic substrate 116 is PDMS treated by oxygen plasma to improve its hydrophilicity.

As a natural biomaterial, the amino acid biocrystal network 78 and piezoelectric thin film 42 are biocompatible and biodegradable. The amino acid biocrystal network 78 of interconnected microfiber branches 74 is primarily uniform in structure across the entire substrate 116 forming the piezoelectric thin film 42. The total thickness of the piezoelectric thin film 42 may be between 20 and 50 micrometers and less than 50 micrometers and less than 40 micrometers and approximately 30 micrometers.

The resulting piezoelectric thin film 42 has a stretchability that can endure up to 40% tensile strain resembling the stretchability range of human tissue and organs to which the piezoelectric thin film 42 would be attached. The high stretchability demonstrated by the amino acid biocrystal network 78 is more than 20 times higher than the maximum allowed strain in amino acid, peptide or protein crystals (fracture limit ~1%) and is even higher than those of piezoelectric ceramics. The stretchability of piezoelectric thin film 42 is orders of magnitudes higher than the fracture limit of bulk crystals.

In certain embodiments, transverse stretching (perpendicular to growth direction 69) widens the truss units to about 34-170 μm in width without showing any signs of fracture or detachment of the amino acid biocrystal network 78. The angle (θ) between two microfibrils expands from 18.3 degrees to 24.4 degrees as the transverse tensile strain increases from 0 to 40%. When stretched longitudinally (along growth direction 69) the truss units lengthen to about 170-850 μm, and the film elongation is compensated by "closing" or narrowing the open meshes with narrowed intersection angles (θ). The stretchability along the two different directions is a result of the elongated truss-like pattern that allowed more room for transverse expansion as well as the flexibility of the amino acid biocrystal network 78.

The resulting piezoelectric thin film 42 has a well crystallized structure with generally aligned polar orientations along the growth axis 69. The resulting piezoelectric thin film 42 has a consistent and uniform phase response over the entire surface, indicating well-aligned dipole distribution throughout the entire thin film 42. The stretchability and structural integrity allow the amino acid biocrystal network 78 to show a strong piezoelectricity under various straining conditions.

Exemplary embodiments of amino acid biocrystal network 78 fabrication on hydrophilic substrates are described in Examples 2 and 3 below. An exemplary embodiment of energy generator 12 fabrication and its results are described in Example 3 below.

Example 1: Growth of DL-Alanine Microfiber (MF) Network on Hydrophilic Substrates DL-alanine powders (Santa Cruz Biotechnology, Inc.) were dissolved in a biphasic solution composed of 20% deionized (DI) water and 80% ethanol (200 Proof). The solution was sonicated in an ultrasonic bath for 1 h at room temperature (25° C.) to enable homogeneity. 15 ml DL-alanine solution (0.5 mg/ml) was then added into a 24 ml glass vial (28×70 mm, VWR International) to prepare for growth.

By placing the glass vials in a customized growth chamber with a controlled humidity (10%-15%), air flow, and temperature (23° C.), hydrophilic substrates immersed in the solution was vertically pulled out at a very slow speed of 25 μm/min by a modified syringe pump (Harvard Apparatus, Harvard Bioscience, Inc.). The evaporation rate of solution was set to be as low as ~55 mg/h by controlling the air flows inside the growth chamber.

Example 2: Growth of DL-Alanine Microfiber (MF) Network on Elastomers

Poly(methyl methacrylate) (PMMA) (Mw ~97000, Sigma Aldrich) was dissolved in a chloroform benzene (CB) solution (Anhydrous 99.8%, Sigma Aldrich). The PMMA solution (1 wt. %) was first spin coated on a glass slide at a speed of 3000 rpm for 30 s. Afterwards, the glass slide was backed in a thermal oven at 80° C. for 10 min to evaporate all remaining CB solution.

The polydimethylsiloxane (PDMS) (Sylgard 184, Tow Corning) solution consisting of pre-mixed elastomer and crosslinker at the ratio of 10 to 1 was then spin coated on the glass slide with a thin layer of PMMA on top. The spin coating speed of PDMS was set at 1000 rpm for 120 s. To accelerate the curing process, the spin coated PDMS was then baked in a thermal oven at 75° C. for 3 hours. Further, the surface of the fully cured PDMS was treated by oxygen plasma (100 W for 200 s) in a plasma etching system (PlasmaEtch PE-200).

After surface modification, the PDMS/PMMA/Glass substrate was immersed into the DL alanine solution (0.5 mg/ml), and then was vertically pulled out at a constant speed of 25 μm/min. The evaporation rate of solution was set to be as low as ~55 mg/h by controlling the air flows inside the chamber.

To make a freestanding MF network/elastomer film, the PDMS/PMMA/Glass substrate was immersed in an acetonitrile (Anhydrous 99.8%, Sigma Aldrich) solution to remove the PMMA in between. Once the PMMA was removed, the MF network/PDMS would spontaneously detach from the glass slide.

Example 3: Device Fabrications and Characterizations

The stretchable electrode was made by transferring percolated silver (Ag) nanowires (NWs) on top of PDMS substrates. The Ag NW solution (XFNANO, 20 mg/mL) was spin-casted on Si substrate and dried at 70° C. for 5 min. The PDMS solution consisting of crosslinker and elastomer with 1:10 volume ratio was spin-coated for 40 s onto Ag NWs electrodes. The PDMS was cured for 4 h at 70° C., and then the percolated Ag NWs were partially embedded into the PDMS matrix to form a stretchable electrode. The Ag NWs/PDMS stretchable electrode was then peeled off from the Si substrate.

The conductivity of stretchable Ag electrode under strains was measured by a multimeter (DMM 6500, Keithley). The piezoelectric network/PDMS film was made in close contact with the percolated Ag NWs/PDMS film, and they were further packaged by additional top and bottom PDMS encapsulation layers (without fully cured) through lamination. The whole device was then placed in a thermal oven (45° C.) for curing for 10 h. The voltage outputs of the piezoelectric device with/without strains were measured by connecting two probes of a low-noise voltage preamplifier (Stanford Research Systems, model SR560) into the single electrode and ground, respectively.

The NG could retain a very low resistivity of <50 Ω under strains up to 25% in all directions. The Ag NWs were placed in direct contact with the DL-alanine MFs to ensure effective collection of piezoelectric responses. The complete NG device was soft, thin, and able to bear large twist deformations. The energy generation performance was characterized by measuring the voltage output between the Ag electrode and ground in response to a low-frequency (1 Hz) pressure oscillation (~156 kPa). Meanwhile, the NG was stretched to 20% along the same series of directions from 0 degrees to 90 degrees, the peak-to-peak voltage output of ~90 mV was obtained on an external load of 100 MΩ from all strain directions. These values also matched the voltage output (80 mV) measured without introducing any lateral strain. The relatively stable piezoelectric output along different stretching directions suggested that the DL-alanine-based NG device could function appropriately under random stretching directions that can often be found in biological systems.

The multidirectional stretchability allows the NG to conform to skin or tissue surfaces and to be responsive to irregular mechanical motions. For example, it could serve well as a piezoelectric tactile sensor particularly for body locations that often subject to large deformations, such as knuckles and wrist.

It is understood that although a preferred embodiment of the amino acid solute 60 is described with respect to DL-alanine solute, the amino acid solute 60 may also be composed of other amino acids, peptides, or proteins that exhibit similar nanofibril growth behavior when dissolved in a solvent. It this respect, the desired building block molecules have the quality of binding with the solvent molecules to divert growth behavior from a side facet of the building block molecules to a growth front of the building block molecules. Thus, the formation of a repeating bifurcating feature (and joining feature) along the side facet may be produced as described above.

Similarly, although a preferred embodiment of the water-alcohol solvent 62 is described with respect to a water-ethanol solvent, the water-alcohol solvent 62 may be a solvent with preferred molecular bonding to the building block molecules to divert growth behavior from a side facet of the building block molecules to a growth front of the building block molecules. Thus, the formation of a repeating bifurcating feature (and joining feature) along the side facet may be produced as described above.

The applications of the piezoelectric thin film 42 described above with or implanted within the human body may be as described in the following applications: U.S. application Ser. No. 16/009,553, entitled "Self-Powered, Auto-Responsive Implanted Vagal Nerve Stimulator for Weight Control"; U.S. application Ser. No. 16/376,178, entitled "Electric Bandage for Accelerated Wound Recovery"; U.S. application Ser. No. 16/851,400, entitled "3D Printed and In-Situ Poled Flexible Piezoelectric Pressure Sensor" and U.S. application 63/093,860, entitled "Biodegradable Transient Battery Built on Core-Double-Shell Zinc Microparticle Networks," whereby each is assigned to the present applicant and each of which is hereby incorporated by reference.

References to microfiber and nanofibril "branches" and "bifurcations" are used interchangeably throughout and are not meant to limit the number of divisions existing in the microfiber network.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

We claim:

1. A thin film of piezoelectric material comprising:

a network of amino acid microfibers composed of nanofibrils with aligned polarization along an axis and comprising a first branch of microfibers; and a second branch of microfibers;

wherein the first and second branches of microfibers are joined and separated repeatedly along the axis to form mesh openings therebetween to permit an increase in width and length of the mesh openings when stretched.

2. The thin film of piezoelectric material of claim 1 wherein the microfibers are composed of DL-alanine nanofibrils.

3. The thin film of piezoelectric material of claim 1 wherein the mesh openings are triangular or quadrilateral in shape.

4. The thin film of piezoelectric material of claim 1 wherein the width of the mesh openings is increased and the length of the mesh openings is decreased when stretched perpendicular to the axis.

5. The thin film of piezoelectric material of claim 4 wherein the length of the mesh openings is increased and the width of the mesh openings is decreased when stretched along the axis.

6. The thin film of piezoelectric material of claim 1 wherein the first branch of microfibers and second branch of microfibers are joined at an angle in a range of about 15 to 30 degrees when stretched perpendicular to the axis.

7. The thin film of piezoelectric material of claim 6 wherein the first branch of microfibers and second branch of microfibers are joined at an angle in a range of about 10 to 25 degrees when stretched along the axis.

8. The thin film of piezoelectric material of claim 1 wherein the microfibers have a growth front extending perpendicular to side facets extending along the axis wherein the first and second branch of microfibers are joined and separated along the side facets of the microfibers.

9. The thin film of piezoelectric material of claim 1 further comprising alcohol molecules wherein the alcohol molecules are bonded to carboxyl groups of the microfibers.

10. The thin film of piezoelectric material of claim 9 wherein the first and second branches of microfibers are joined by interfacial hydrogen bonds.

11. The thin film of piezoelectric material of claim 1 wherein the network of amino acid microfibers can withstand up to 40% tensile strain along multiple directions without breaking.

12. The thin film of piezoelectric material of claim 1 wherein the network of amino acid microfibers further comprises a plurality of first branches of microfibers; and a plurality of second branches of microfibers;

wherein the pluralities of first and second branches of microfibers are joined and separated repeatedly along the axis to form mesh openings therebetween to permit an increase in width and length of the mesh openings when stretched.

13. The thin film of piezoelectric material of claim 1 wherein the network of amino acid microfibers is less than 50 micrometers thick.

14. The thin film of piezoelectric material of claim 1 further comprising at least one electrode having a lower resistance than a surface of the network of amino acid microfibers and at least one wire connected to the at least one electrode to deliver an electric charge from the thin film of piezoelectric material.

15. A method of manufacturing a thin film of piezoelectric material comprising:

mixing a solute of amino acid molecules with a solvent of water-alcohol to form a biphasic solution;

pulling a plurality of amino acid nanofibrils from the biphasic solution along an axis at a predetermined rate; and forming a network of amino acid microfibers composed of nanofibrils with aligned polarization along the axis and comprising a first branch of microfibers and a second branch of microfibers wherein the first and second branches of microfibers are joined and separated repeatedly along the axis to form mesh openings to permit an increase in width and length of the mesh openings when stretched.

16. The method of claim 15 wherein the solute of amino acid is DL-alanine molecules.

17. The method of claim 15 wherein the solvent of water-alcohol is water-ethanol solvent.

18. The method of claim 17 wherein a ratio of ethanol-to-water is about 3:1 to 4:1.

19. The method of claim 15 wherein (a) alcohol molecules of the solution of water-alcohol bond to carboxyl groups of the microfibers and (b) amino and carboxyl groups of the microfibers form hydrogen bonds, to define a bifurcating feature and a joining feature between the first and second branches of microfibers.

20. The method of claim 15 further comprising stretching the thin film of piezoelectric material along multiple directions to 40% tensile strain without breaking the thin film of piezoelectric material.

* * * * *